United States Patent
Schapendonk et al.

(10) Patent No.: US 11,460,522 B2
(45) Date of Patent: Oct. 4, 2022

(54) SENSITIVITY ADJUSTMENT OF RESISTIVE SENSOR SYSTEM

(71) Applicant: NXP B.V., Eindhoven (NL)

(72) Inventors: Edwin Schapendonk, Oss (NL);
Hendrikus van Iersel, Wijchen (NL);
Maciej Skrobacki, Heteren (NL)

(73) Assignee: NXP B.V., Eindhoven (NL)

( * ) Notice: Subject to any disclaimer, the term of this patent is extended or adjusted under 35 U.S.C. 154(b) by 116 days.

(21) Appl. No.: 17/032,266

(22) Filed: Sep. 25, 2020

(65) Prior Publication Data
US 2022/0099762 A1   Mar. 31, 2022

(51) Int. Cl.
*G01R 1/30* (2006.01)
*G01R 33/09* (2006.01)
*G01R 33/00* (2006.01)

(52) U.S. Cl.
CPC ......... *G01R 33/09* (2013.01); *G01R 33/0088* (2013.01)

(58) Field of Classification Search
CPC ............................ G01R 33/09; G01R 33/0088
See application file for complete search history.

(56) References Cited

PUBLICATIONS

Geng, Xueyang et al.; "High Speed Channel Resistive Sensor Interface with RHBD in 0.5 um SiGe BiCMOS for UWT from 180C to 120C"; IEEE Bipolar/BICMOS Circuits and Technology Meeting, Atlanta, GA, USA Oct. 9-11, 2011; IEEE Explore; 4 pages (Nov. 18, 2011).
Li, Zhelu et al.; "A Front-End Circuit with 16-channel 12-bit 100-kSps RC-Hybrid SAR ADC for Industrial Monitoring Application"; IEEE Explore Jan. 5, 2017; IEEE Asia Pacific Conference on Circuits and Systems, Oct. 25-28, 2016, Jeju, South Korea; 4 pages (2016).

*Primary Examiner* — Alesa Allgood

(57) ABSTRACT

A resistive sensor system includes resistive sensor pairs formed of first and second sensors of opposite sensitivity directions to a measured property. Each resistive sensor pair includes one of the first sensors having a first terminal and a second terminal, and one of the second sensors having a third terminal and a fourth terminal. The fourth terminal is coupled to the second terminal of the first sensor. The system further includes multiple noninverting switch elements, each having a noninverting output coupled to the first terminal of one the first sensors, and multiple inverting switch elements, each having an inverting output coupled to the third terminal of one of the second sensors. For each resistive sensor pair, the noninverting and inverting switch elements receive a switch signal for controlling the noninverting and inverting switch elements such that the first and second sensors are biased in opposition to one another.

18 Claims, 6 Drawing Sheets

*FIG. 1*

PRIOR ART

| | GAIN - SWITCH SIGNAL | | | | | | | | NORMALIZED GAIN FOR $V_{OUT}$ |
|---|---|---|---|---|---|---|---|---|---|
| | $62_0$ | $62_1$ | $62_2$ | $62_3$ | $62_4$ | $62_5$ | $62_6$ | $62_7$ | |
| | 0 | 0 | 0 | 0 | 0 | 0 | 0 | 0 | 1.00 |
| | 0 | 0 | 0 | 0 | 0 | 0 | 0 | 1 | 0.75 |
| | 0 | 0 | 0 | 0 | 0 | 0 | 1 | 1 | 0.50 |
| | 0 | 0 | 0 | 0 | 0 | 1 | 1 | 1 | 0.25 |
| | 0 | 0 | 0 | 0 | 1 | 1 | 1 | 1 | 0.00 |
| | 0 | 0 | 0 | 1 | 1 | 1 | 1 | 1 | -0.25 |
| | 0 | 0 | 1 | 1 | 1 | 1 | 1 | 1 | -0.50 |
| | 0 | 1 | 1 | 1 | 1 | 1 | 1 | 1 | -0.75 |
| | 1 | 1 | 1 | 1 | 1 | 1 | 1 | 1 | -1.00 |

FIG. 7

| GAIN | LINE PATTERN |
|---|---|
| 00000000 | —— |
| 00000001 | – – – |
| 00000011 | - - - |
| 00000111 | ······· |
| 00001111 | —— |
| 00011111 | ········ |
| 00111111 | –·–·– |
| 01111111 | –··–··– |
| 11111111 | –···–···– |

SENSITIVITY ADJUSTMENT OF RESISTIVE SENSOR SYSTEM

TECHNICAL FIELD OF THE INVENTION

The present invention relates generally to sensors. More specifically, the present invention relates to a resistive sensor system having sensitivity adjustment capability.

BACKGROUND OF THE INVENTION

Resistive sensors are often used to measure quantities like displacement, pressure, magnetic field strength, and so forth. Resistive sensors are used to create electrical current or voltage, depending upon the measured physical property. Typically, resistive sensors have a defined input signal range, outside of which the generated electrical output signal could reach the range limits of the analog front-end, which in turn, could be catastrophic for certain applications.

To mitigate this problem, either passive dividers or active circuits have been traditionally used to amplify or attenuate the electrical signal. These passive dividers and active circuits can introduce additional error sources (e.g., noise, nonlinearity, and so forth) in the processing path at significant integrated circuit (IC) area penalty and/or power penalty to assure high performance and accuracy. Therefore, there exists a need for an alternative approach for attenuating the electrical output signal in a resistive sensor system.

SUMMARY

Aspects of the disclosure are defined in the accompanying claims.

In a first aspect, there is provided a resistive sensor system comprising resistive sensor pairs formed of first and second sensors of opposite sensitivity directions to a measured property. Each resistive sensor pair comprises one of the first sensors, the first sensor having a first terminal and a second terminal, and one of the second sensors, the second sensor having a third terminal and a fourth terminal, the fourth terminal being coupled to the second terminal of the first sensor. The resistive sensor system further comprises multiple noninverting switch elements, each noninverting switch element having a noninverting output coupled to the first terminal of one the first sensors, and multiple inverting switch elements, each inverting switch element having an inverting output coupled to the third terminal of one of the second sensors, wherein for each resistive sensor pair, the noninverting and inverting switch elements coupled to corresponding first and second sensors are configured to receive a switch signal, the switch signal being configured to control the noninverting and inverting switch elements such that the first and second sensors are biased in opposition to one another.

In a second aspect, there is provided a resistive sensor system comprising resistive sensor pairs formed of first and second sensors of opposite sensitivity directions to a measured property. Each resistive sensor pair comprises one of the first sensors, the first sensor having a first terminal and a second terminal, and one of the second sensors, the second sensor having a third terminal and a fourth terminal, the fourth terminal being coupled to the second terminal of the first sensor. The resistive sensor system further comprises multiple noninverting switch elements, the noninverting switch elements comprising first voltage buffers, each of the first voltage buffers having a first input terminal and a noninverting output coupled to the first terminal of one the first sensors, and multiple inverting switch elements, the inverting switch elements comprising second voltage buffers, each of the second voltage buffers having a second input terminal and an inverting output coupled to the third terminal of one of the second sensors, wherein for each resistive sensor pair, the noninverting and inverting switch elements coupled to corresponding first and second sensors are configured to receive a switch signal; the switch signal comprises a digital voltage signal having a first logic state or a second logic state, the first logic state defining a first bias voltage and the second logic state defining a second bias voltage; each of the first voltage buffers is configured to receive the digital voltage signal at the first input terminal and output from the first output terminal one of the first and second bias voltages corresponding to the first or second logic state of the digital voltage signal; and each of the second voltage buffers is configured receive the digital voltage signal at the second input terminal, invert the digital voltage signal to the other of the first or second states, and output from the second output terminal the other of the first and second bias voltages corresponding to the other of the first or second logic states such that the first and second sensors are biased in opposition to one another.

In a third aspect, there is provided a method for adjusting a sensitivity of a resistive sensor system, the resistive sensor system including resistive sensor pairs, the resistive sensor pairs having first and second sensors of opposite sensitivity directions to a measured property, each resistive sensor pair comprising one of the first sensors and one of the second sensors, the first sensor having a first terminal and a second terminal, the second terminal being coupled to an output node, the second sensor having a third terminal and a fourth terminal, the fourth terminal being coupled to the second terminal of the first sensor at the output node, and the method comprises for a first portion of the resistive sensor pairs, receiving a first bias voltage at the first terminal of the first sensor and receiving a second bias voltage at the third terminal of the second sensor; for a second portion of the resistive sensor pairs, receiving a second bias voltage at the first terminal of the first sensor and receiving a first bias voltage at the third terminal of the second sensor; and producing an output signal at the first node in response to the measured property, the output signal being at a sensitivity defined by a first quantity of the resistive sensor pairs of the first portion and a second quantity of the resistive sensor pairs of the second portion.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a resistive sensor system and methodology for adjusting the overall sensitivity of the resistive sensor system. More particularly, the system includes capability for controlling the biasing of one or more resistive sensor pairs in a bridge circuit of a resistive sensor system in such a way that the overall gain of the resistive sensor system changes, but the thermal noise floor and the output impedance of the bridge circuit remains unchanged. Further, the electrical output signal of the resistive sensor system can be attenuated using the resistive sensor pairs themselves, resulting in minimal integrated circuit (IC) area and power overhead, and no additional error sources in the processing path.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

Much of the inventive functionality and many of the inventive principles are best implemented with or in ICs including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to the present invention, further discussion of such structures and ICs, if any, will be limited to the essentials with respect to the principles and concepts of the various embodiments.

Figure 1:
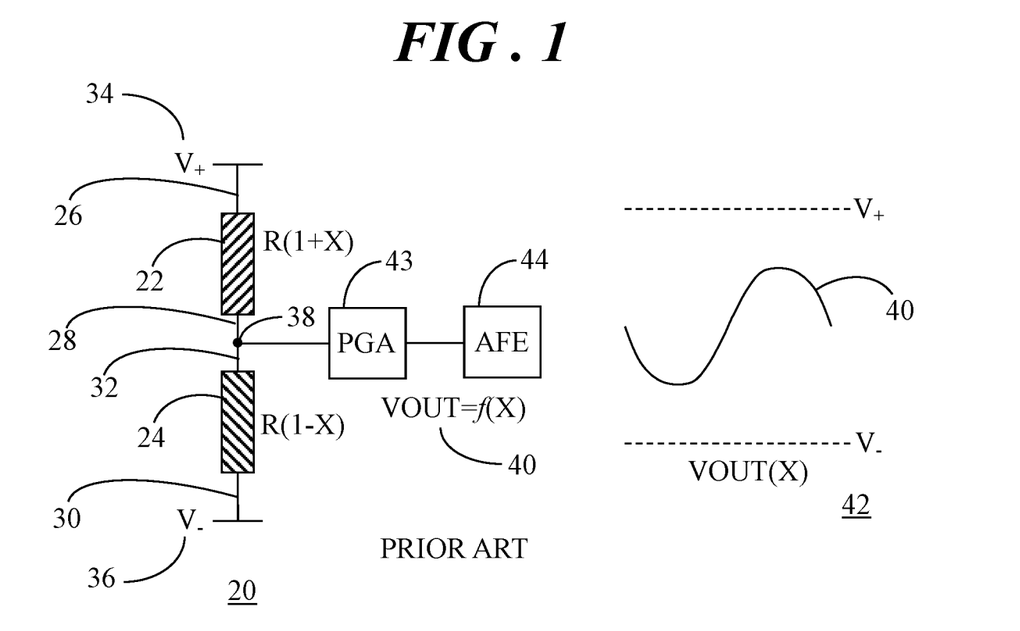
FIG. 1 shows a diagram of a prior art resistive sensor bridge circuit.

Referring to FIG. 1, FIG. 1 shows a diagram of a prior art resistive sensor bridge circuit 20. Bridge circuit 20 includes two or more resistive sensors having opposite sensitivity directions to a measured property. In this example, bridge circuit 20 includes one or more first resistive sensors 22 (one shown) having a first sensitivity direction and one or more second resistive sensors 24 (one shown) having an opposite second sensitivity direction. In FIG. 1, the first sensitivity direction of first resistive sensor 22 is represented by $R(1+X)$, where "X" is the measured property and the resistance "R" increases in response to the measured property, and the second sensitivity direction of second resistive sensor 24 is represented by $R(1-X)$, where "R" decreases in response to the measured property. It should be understood that the use of relational terms, if any, such as first and second, top and bottom, and the like are used solely to distinguish one from another entity or action without necessarily requiring or implying any actual such relationship or order between such entities or actions.

First resistive sensor 22 includes a first terminal 26 and a second terminal 28 and second resistive sensor 24 includes a third terminal 30 and a fourth terminal 32. First terminal 26 of first resistive sensor 22 is coupled to a first voltage source, referred to herein as a positive voltage source 34 (providing $V_+$) and third terminal 30 of second resistive sensor 24 is coupled to a second voltage source referred to herein as a negative voltage source 36 (providing $V_-$). Fourth terminal 32 of second resistive sensor 24 is coupled to second terminal 28 of first resistive sensor 22 at an output node 38 of bridge circuit 20. In FIG. 1, an output signal (referred to herein as an output voltage 40), of bridge circuit 20 at output node 38 is represented by $VOUT=f(X)$. A waveform 42 provided in FIG. 1 shows that output voltage 40 reacting to the measured property, X, may vary over time (t) between $V_+$ and $V_-$.

Output voltage 40 is directly proportional to the measured property (e.g., magnetic field, pressure, and so forth). In some instances a programmable gain amplifier (PGA) 43 may be incorporated into the system to amplify or attenuate output voltage 40. A sensing circuit, sometimes referred to as an analog front-end 44 (labeled AFE) receiving output voltage 40 should be able to measure small amplitudes of output voltage 40 with sufficient accuracy. Additionally, analog front-end 44 should be able to process high amplitudes caused by, for example, stray distortion signals that may be superimposed on top of the desired signal.

Figure 2:
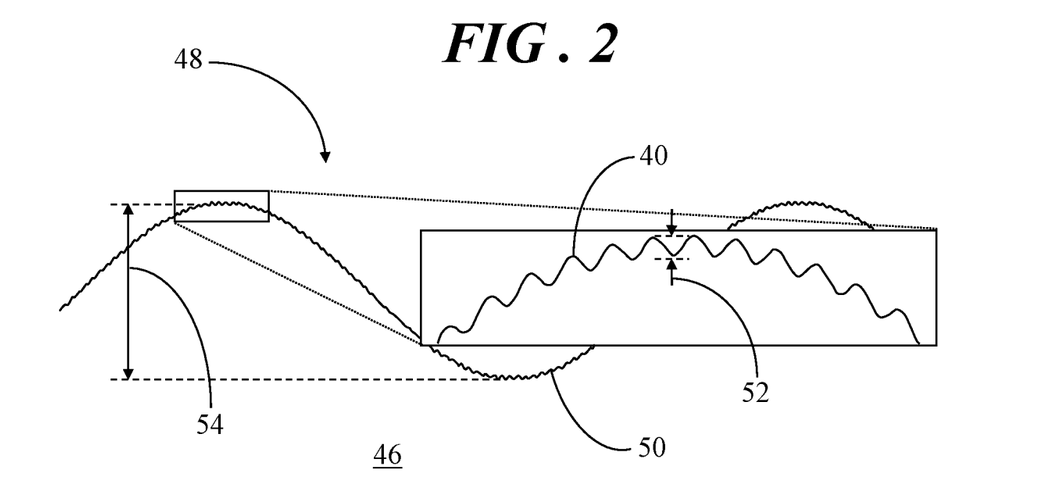
FIG. 2 shows a diagram of an example waveform of an output signal of the resistive sensor bridge circuit of FIG. 1.

Referring to FIG. 2 in connection with FIG. 1, FIG. 2 shows a diagram of an example output waveform 46 of an output signal 48 of resistive sensor bridge circuit 20 (FIG. 1). Output signal 48 of bridge circuit 20 may include the desired signal, e.g., output voltage 40 most visible in the enlarged portion of output signal 48, and a distortion signal 50 superimposed on output voltage 40. Output voltage 40 may have a signal amplitude 52, and distortion signal 50 may have a distortion amplitude 54 having a range that may span over several orders of magnitude greater than signal amplitude 52.

The range of distortion amplitude 54 can result in challenging requirements on the dynamic range (DR) for analog front-end 44. For example, if analog front-end 44 is required to measure amplitudes ranging from one volt to one millivolt (e.g., three decades apart) with one microvolt accuracy (e.g., another three decades), the required dynamic range for analog front-end 44 may be as high as one hundred and twenty decibels. Often, for extremely high signal amplitudes, the accuracy requirements are relaxed. In such a situation, maintaining a system with 120 dB dynamic range is not practical because it would result in overdesign in terms of power and circuit area.

Some prior art solutions incorporate a passive divider circuit having an input coupled to output node 38 of bridge circuit 20 and an output coupled to analog front-end 44 to reduce signal swing. A passive divider circuit can attenuate the output signal. However, it also increases the thermal noise floor with the introduction of additional devices in the signal processing path, influences the sensor operating condition with the load current caused by a relatively low-ohmic divider, and affects the output impedance which could be relevant to analog front-end 44.

An alternative solution to avoid some of the issues of passive division is to use a programmable gain amplifier (e.g., PGA 43) having an input coupled to output node 38 of bridge circuit 20 and an output coupled to the input of analog front-end 44. PGA 43 can, when needed, attenuate the high amplitude output signal 48 by a factor of "k" such that analog front-end 44 will not clip to its limits. PGA 43 can also, when needed, amplify small signals. The operating conditions of bridge circuit 20 are not affected due to the high input impedance of the PGA. However, the PGA itself appears in the signal processing path which, whether amplifying or attenuating a signal, can add noise and can result in significant costs in terms of power consumption and circuit area.

When analog front-end 44 is used in a system with digital signal processing following the signal processing path of analog front-end 44, analog-to-digital converters (ADCs) are required. The ADCs are tailored to be used for a specific signal range. The dynamic range requirements directly translate in the minimum Effective Number of Bits (ENOB). For example, a dynamic range of 120 dB translates into an ENOB of 20 bits, which is a difficult requirement for an ADC. Techniques like dynamic-zoom ADC or ADCs with a range selection, higher order sigma/delta ADCs, or high over sampling ranges may sometimes be implemented, again at the penalty of increased power consumption and circuit area.

Embodiments described below entail a topology and methodology for efficiently attenuating an electrical output signal from a resistive sensor system. Further, the electrical output signal may be attenuated passively using existing sensor circuitry. Accordingly, a wide dynamic range may be achieved, using full sensitivity of the sensor bridge circuit for low signal amplitudes and attenuating the output signal for high amplitudes without increasing the thermal noise floor of the resistive sensor system. Such an approach mitigates the need to use costly active attenuation circuitry (e.g., PGA's) or to extend the dynamic range of the analog front-end.

Figure 3:
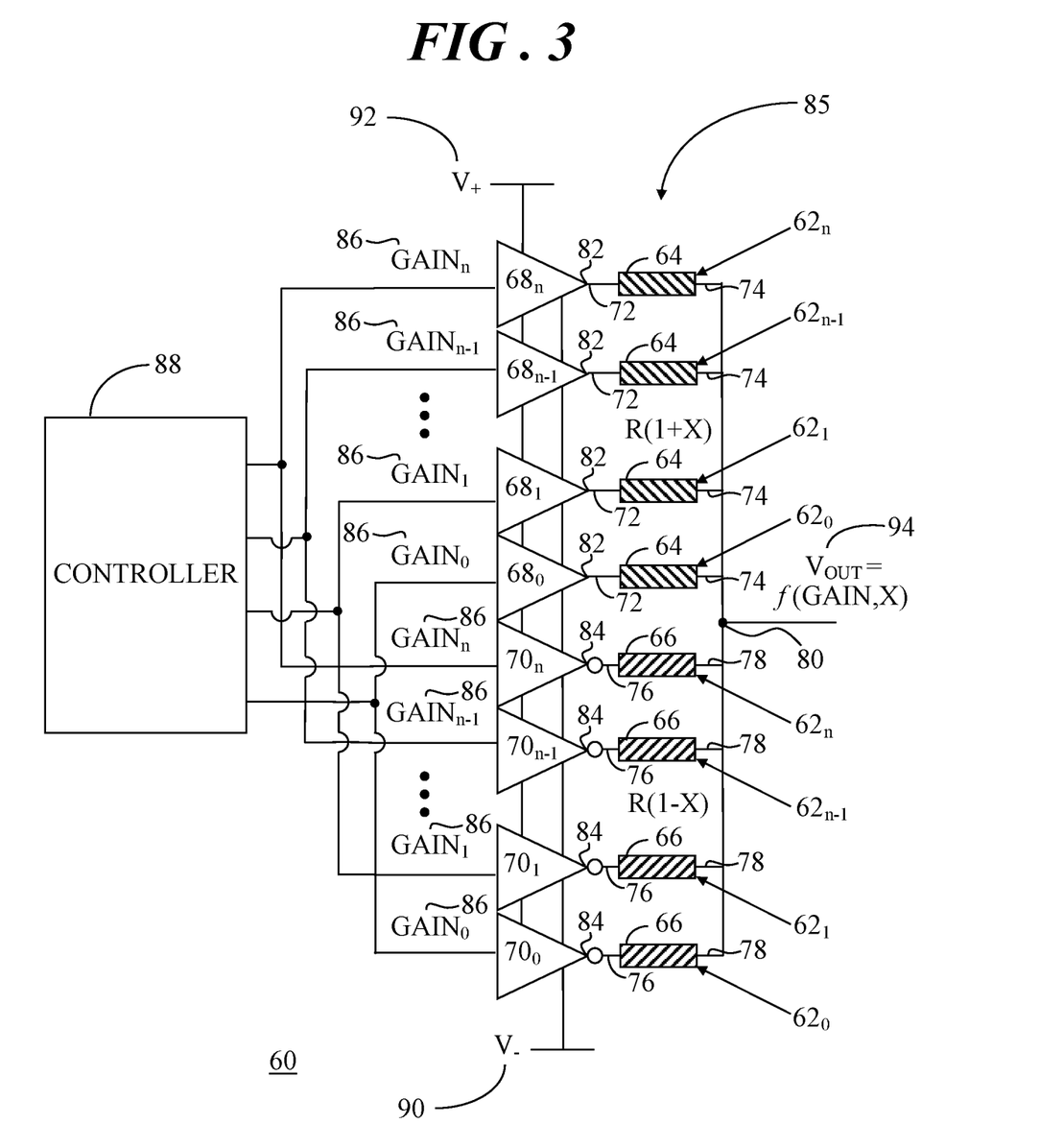
FIG. 3 shows a diagram of a resistive sensor system in accordance with an embodiment.

FIG. 3 shows a diagram of a resistive sensor system 60 in accordance with an embodiment. Resistive sensor system 60 includes multiple resistive sensor pairs 62 formed of first and second resistive sensors 64, 66 of opposite sensitivity directions to a measured property. In an example, the first sensitivity direction of first sensors 64 is a positive sensitivity, represented by R(1+X), and the second sensitivity direction of second sensors 66 is a negative sensitivity, represented by R(1−X). In some embodiments, first and second resistive sensors 64, 66 are magnetic field sensors that provide a changing resistance in response to a changing magnetic field. First sensors 64 each provide a resistance "R" that changes in the positive direction such that the sensor resistance equals R(1+X), where "X" is a relative change in resistance due to the measured property and "R" increases due to signal "X". Second sensors 66 each provide a resistance "R" that changes in the negative direction such that the sensor resistance equals R(1−X). Although magnetic field sensors are mentioned herein, alternative embodiments may implement other resistive sensors (e.g., pressure, displacement, and so forth).

In an example of "n" resistive sensor pairs, a first resistive sensor pair $62_0$ includes first and second sensors 64, 66, a second resistive sensor pair $62_1$ includes first and second sensors 64, 66, and so forth, through an "nth" resistive sensor pair $62_n$ that likewise includes first and second sensors 64, 66. FIG. 3 shows n=4 resistive sensor pairs 62. However, resistive sensor system can include any quantity of "n" being greater than or equal to two resistive sensor pairs 62 (denoted by ellipses in FIG. 3). In general discussion the resistive sensor pairs will be referred to altogether as resistive sensor pairs 62.

Resistive sensor system 60 further includes multiple noninverting switch elements 68 and multiple inverting switch elements 70. Noninverting switch elements 68 are labeled $68_0$, $68_1$, $68_{n-1}$, $68_n$ to correspond with nomenclature used with resistive sensor pairs $62_0$, $62_1$, $62_{n-1}$, $62_n$. Likewise, inverting switch elements 70 are labeled $70_0$, $70_1$, $70_{n-1}$, $70_n$ to correspond with nomenclature used with resistive sensor pairs $62_0$, $62_1$, $62_{n-1}$, $62_n$. However, in general discussion the noninverting switch elements will be referred to altogether as noninverting switch elements 68 and the inverting switch elements will be referred to altogether as inverting switch elements 70.

Each of first sensors 64 has a first terminal 72 and a second terminal 74, and each of second sensors 66 has a third terminal 76 and a fourth terminal 78. Fourth terminal 78 of each of second sensors 66 is coupled to second terminal 74 of each of first sensors 64 at an output node 80 of resistive sensor system 60. Thus, the interconnection of first and second sensors 64, 66 of resistive sensor pairs 62 yields a single-ended resistive sensor bridge circuit 85. Each noninverting switch element 68 has a noninverting output 82 coupled to first terminal 72 of one of first sensors 64 and each inverting switch element 70 has an inverting output 84 coupled to third terminal 76 one of second sensors 66.

For each resistive sensor pair 62, noninverting and inverting switch elements 68, 70 coupled to their corresponding first and second sensors 64, 66 are configured to receive switch signals 86. Switch signals 86 are labeled $GAIN_0$, $GAIN_1$, $GAIN_{n-1}$, and $GAIN_n$ to again correspond with nomenclature used with resistive sensor pairs $62_0$, $62_1$, $62_{n-1}$, $62_n$. In some embodiments, a controller 88 in communication with each of switch elements 68, 70 may provide switch signals 86 to each of noninverting and inverting switch elements 68, 70. Switch signals 86 may be digital voltage signals having a first logic state (e.g., "0") defining a first bias voltage or a second logic state (e.g., "1") defining a second bias voltage. In an embodiment, a first bias voltage 90, $V_-$, is provided by a negative voltage source and a second bias voltage 92, $V_+$, is provided by a positive voltage source. As will be discussed in significantly greater detail below, switch signals 86 are configured to control the noninverting and inverting switch elements 68, 70 such that the corresponding first and second sensors 64, 66 of the resistive sensor pairs 62 are biased in opposition to one another. Further, the overall gain of resistive sensor system 60 can be adjusted by changing how certain resistive sensor pairs 62 are biased utilizing switch signals 86. Accordingly, an output signal 94, $V_{OUT}$, at output node 80 of resistive sensor system 60 is a function of the overall gain (GAIN) and the measured property (X).

Figure 4:
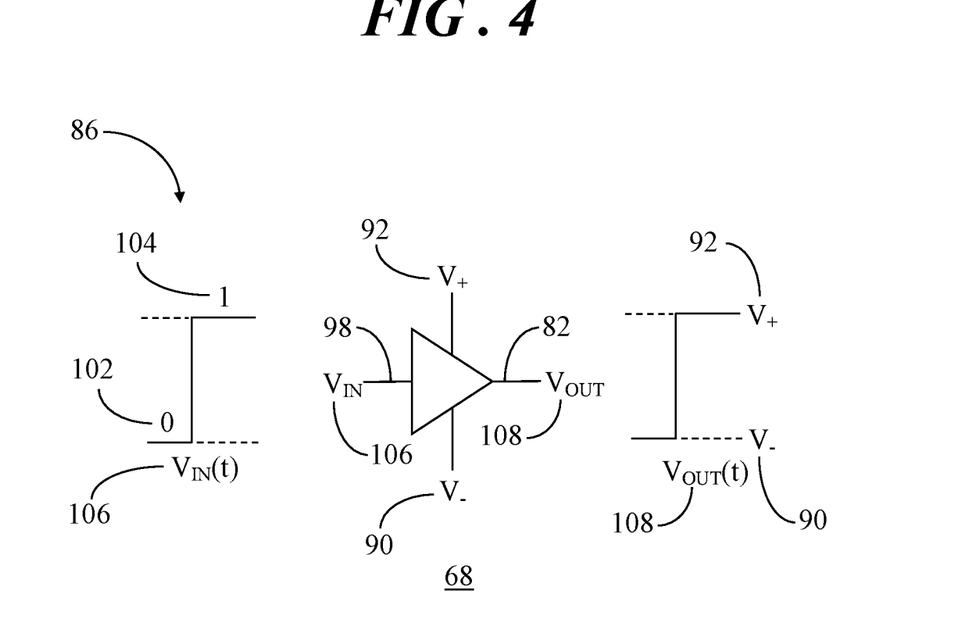
FIG. 4 shows a diagram of a noninverting voltage buffer that may be implemented in the resistive sensor system of FIG. 3 in some embodiments.
Figure 5:
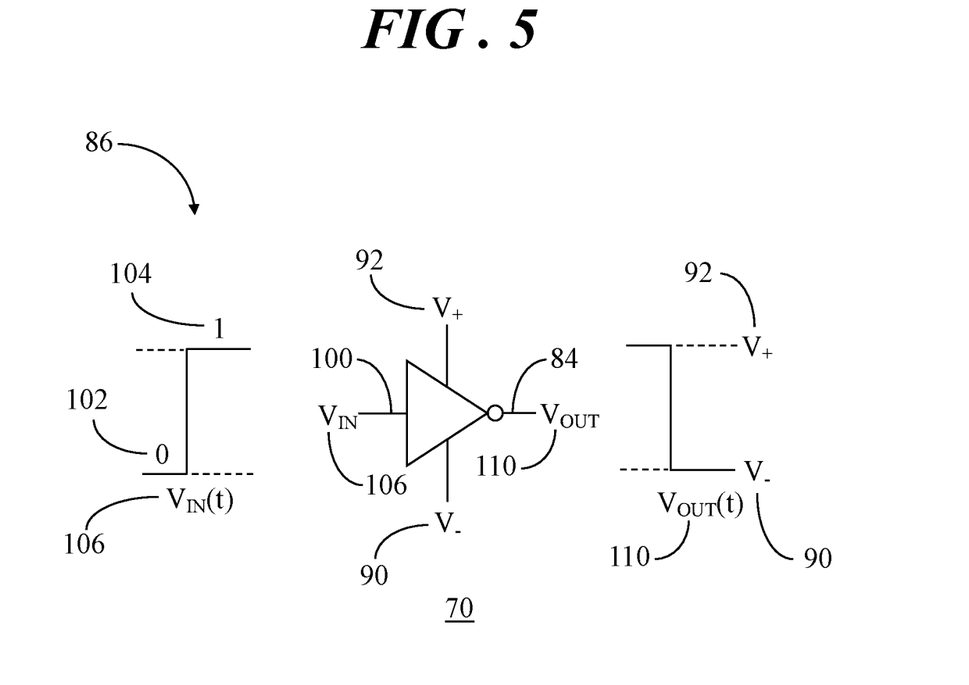
FIG. 5 shows a diagram of an inverting voltage buffer that may be implemented in the resistive sensor system of FIG. 3 in some embodiments.

Referring to FIGS. 3-5, FIG. 4 shows a diagram of one of noninverting switch elements 68 that may be implemented in resistive sensor system 60 (FIG. 3) in some embodiments and FIG. 5 shows a diagram of one of inverting switch elements 70 that may be implemented in resistive sensor system 60 in some embodiments. Noninverting switch elements 68 may comprise noninverting voltage buffers and inverting switch elements 70 may comprise inverting voltage buffers. As such, noninverting switch elements 68 may alternatively be referred to herein as noninverting voltage buffers 68. Similarly, inverting switch elements may alternatively be referred to herein as inverting voltage buffers 70. Each noninverting voltage buffer 68 has a first input terminal 98 and noninverting output 82 and each inverting voltage buffer 70 has a second input terminal 100 and inverting output 84.

Noninverting and inverting voltage buffers 68, 70 "transfer" a digital voltage from the input to the output. In this example, a digital voltage signal having a first logic state 102 of "0" is equal to first bias voltage 90 and a digital voltage signal having a second logic state 104 of "1" is equal to second bias voltage 92. Noninverting and inverting voltage buffers 68, 70 may be Complementary Metal Oxide Semiconductor (CMOS) logic gates supplied in the V(V$_+$, V$_-$) voltage domain, which is also the same domain that first and second sensors 64, 66 can be biased in through noninverting and inverting voltage buffers 68, 70.

Thus, buffers 68, 70 controlling the biasing of first and second sensors 64, 66 can set the outputs from rail-to-rail, which is beneficial for reducing the series impedance of buffers 68, 70. This series impedance should be low enough to stay negligible compared to the impedance of first and second sensors 64, 66. Further, in CMOS technology, buffers 68, 70 will only draw some power during transition between first and second logic states, thereby achieving savings in terms of power consumption. Still further, noninverting and inverting voltage buffers 68, 70 may advantageously provide low-ohmic connection between first and second sensors 64, 66 and first and second bias voltages 90, 92 such that the performance of first and second sensors 64, 66 is not compromised.

In the examples of FIGS. 4 and 5, switch signal 86 comprises a digital voltage signal 106 having first first logic state 102 of "0" equal to first bias voltage 90 or second logic state 104 of "1" equal to second bias voltage 92. When digital voltage signal 106 is first logic state 102, an analog output voltage 108 of noninverting voltage buffer 68 at noninverting output 82 is first bias voltage 90, corresponding to first logic state 102. When digital voltage signal 106 switches to second logic state 104, analog output voltage 108 of noninverting voltage buffer 68 at noninverting output 82 is second bias voltage 92, corresponding to second logic state 104. Conversely, when digital voltage signal 106 is first logic state 102, an analog output voltage 110 of inverting voltage buffer 70 at inverting output 84 is second bias voltage 92, corresponding to second logic state 104. When digital voltage signal 106 is second logic state 104, analog output voltage 110 of inverting voltage buffer 70 at inverting output 84 is first bias voltage 90, corresponding to first logic state 102. In general, only analog output voltage 108 of buffers 68, 70 correspond to V$_+$ and V$_-$ (e.g., first and second bias voltages 90, 92). The input levels to buffers 68, 70 can be different.

Accordingly, all of first and second sensors 64, 66 have one fixed terminal connection to output (e.g., second and fourth terminals 74, 78). However, the input sensor terminal (e.g., first and third terminals 72, 76) can be connected to either first or second bias voltage 90, 92 (e.g., V$_-$ or V$_+$) via noninverting and inverting voltage buffers 68, 70 depending upon the buffer input value (e.g., first or second logic state 102, 104) of switch signals 86. Thus, the biasing of first and second sensors 64, 66 of each of resistive sensor pairs 62 can be changed (e.g., either connected to first or second bias voltage 90, 92) by changing switch signals 86. This technique is in contrast to the fixed biasing of first and second sensors 22, 24 of the prior art resistive sensor bridge circuit 20, discussed in connection with FIG. 1.

Gain settings can be applied by providing switch signals 86 comprising digital voltage signal 106 to noninverting and inverting voltage buffers 68, 70 that are driving resistive sensor pairs 62. It bears repeating that respective first and second sensors 64, 66 in a resistive sensor pair are biased in opposition to one another. Accordingly, noninverting and inverting voltage buffers 68, 70 coupled to first and second sensors 64, 66 of the resistive sensor pair 64 are both driven with the same switch signal 86 (e.g., GAIN$_0$ for resistive sensor pair 62$_0$, GAIN$_1$ for resistive sensor pair 62$_1$, GAIN$_{n-1}$ for resistive sensor pair 62$_{n-1}$, and GAIN$_n$ for resistive sensor pair 62$_n$).

Although noninverting and inverting voltage buffers are utilized as noninverting and inverting switch elements 68, 70 of resistive sensor system 60 (FIG. 3) in some embodiments, other switching elements for switching between first and second bias voltages 90, 92 may alternatively be implemented.

Figure 6:
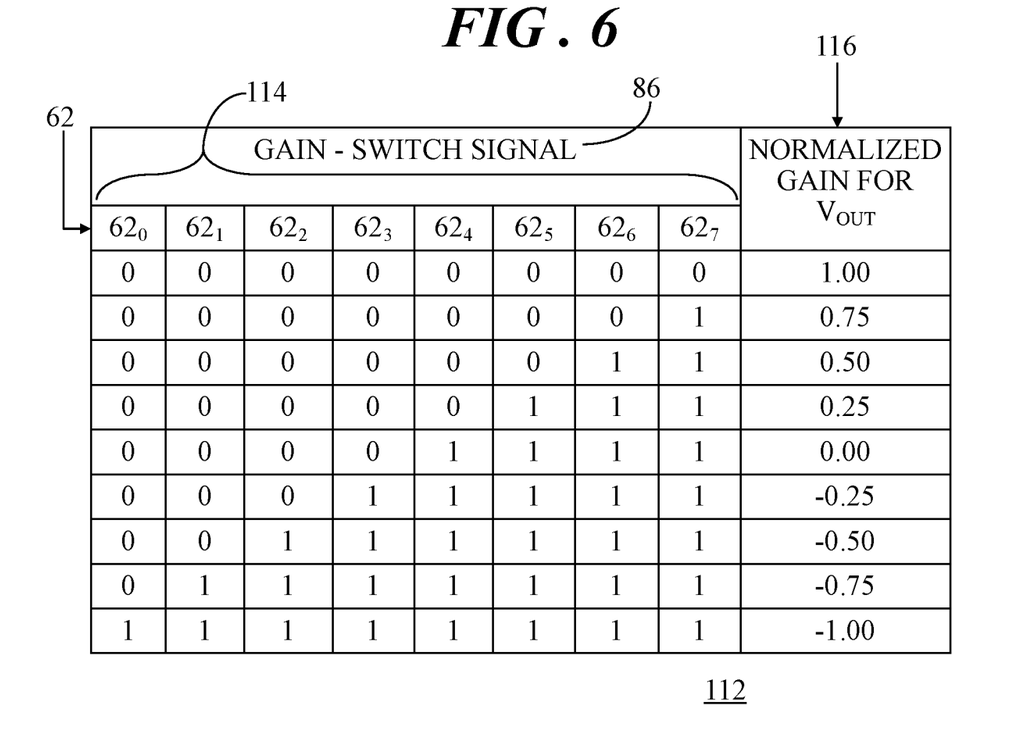
FIG. 6 shows a table summarizing settings of switch signals for resistive sensor pairs of the resistive sensor system of FIG. 3 that can result in an overall system gain for the resistive sensor system.

FIG. 6 shows a table 112 summarizing settings of switch signals 86 for resistive sensor pairs 62 (FIG. 3) of resistive sensor system 60 (FIG. 3) that can result in an overall system gain for resistive sensor system 60. Table 112 shows gain settings 114 which yield various system gains (e.g., normalized system gains 116) for output signal 94, V$_{OUT}$, (FIG. 3) from resistive sensor system 60. In this example, resistive sensor system 60 has eight resistive sensor pairs 62$_n$. In a first example, a gain setting 114 may be "00000000" in which all eight resistive sensor pairs receive switch signals 86 at the same logic state. That is, digital voltage signal 106 of each switch signal 86 input to each resistive sensor pair 62 (e.g., resistive sensor pairs 62$_n$, where "n" equals 0-7) is first logic state 102, "0" (FIGS. 4-5). Accordingly, all eight first sensors 64 of each resistive sensor pair 62$_n$ (coupled to noninverting voltage buffers 68) are connected to first bias voltage 90, V$_-$, and all eight second sensors 66 of each resistive sensor pair 62$_n$ (coupled to inverting voltage buffers 70) are connected to second bias voltage 92, V$_+$. As such, gain setting 114 of "00000000" yields a normalized system gain 116 that is equal to +1.0. Therefore, output signal 94, V$_{OUT}$, from resistive sensor system 60 is 100% (i.e., at full sensitivity).

In a second example, a gain setting 114 may be "00000011" in which six resistive sensor pairs 62 (e.g., a first portion of the resistive sensor pairs) receive switch signals 86 at one logic state and two resistive sensor pairs 62 (e.g., a second portion of the resistive sensor pairs) receive switch signals 86 at the other logic state. That is, digital voltage signal 106 of each switch signal 86 input to resistive sensor pairs 62$_{0-5}$ is first logic state 102, "0" (FIGS. 4-5), and digital voltage signal 106 of each switch signal 86 input to resistive sensor pairs 62$_{6-7}$ is second logic state 104, "1" (FIGS. 4-5). Accordingly, the six first sensors 64 of resistive sensor pairs 62$_{0-5}$ (coupled to noninverting voltage buffers 68) are connected to first bias voltage 90, V$_-$, and the six second sensors 66 of resistive sensor pairs 62$_{0-5}$ (coupled to inverting voltage buffers 70) are connected to second bias voltage 92, V$_+$. Additionally, the two first sensors 64 of resistive sensor pairs 62$_{6-7}$ (coupled to noninverting voltage buffers 68) are connected to second bias voltage 92, V$_+$, and the two second sensors 66 of resistive sensor pairs 62$_{6-7}$ (coupled to inverting voltage buffers 70) are connected to first bias voltage 90, V$_-$. For gain setting 114 of "00000011" the output of the two resistive sensor pairs 62$_{6-7}$ effectively "cancels out" the output of two of resistive sensor pairs 62$_{0-5}$, meaning that only a remaining four of resistive sensor pairs 62$_{0-5}$ are "active" in sensing. As such, gain setting 114 of "00000011" yields a normalized system gain 116 that is equal to +0.50. Therefore, output signal 94, V$_{OUT}$, from resistive sensor system 60 is attenuated to 50% (i.e., half sensitivity).

In a third example, a gain setting 114 may be "00001111" in which four resistive sensor pairs 62 (e.g., a first portion of the resistive sensor pairs) receive switch signals 86 at one logic state and four resistive sensor pairs 62 (e.g., a second portion of the resistive sensor pairs) receive switch signals 86 at the other logic state. That is, digital voltage signal 106 of each switch signal 86 input to resistive sensor pairs $62_{0-3}$ is first logic state 102, "0" (FIGS. 4-5), and digital input voltage 106 of each switch signal 86 input to resistive sensor pairs $62_{4-7}$ is second logic state 104, "1" (FIGS. 4-5). Accordingly, the four first sensors 64 of resistive sensor pairs $62_{0-3}$ (coupled to noninverting voltage buffers 68) are connected to first bias voltage 90, $V_-$, and the four second sensors 66 of resistive sensor pairs $62_{0-3}$ (coupled to inverting voltage buffers 70) are connected to second bias voltage 92, $V_+$. Additionally, the four first sensors 64 of resistive sensor pairs $62_{4-7}$ (coupled to noninverting voltage buffers 68) are connected to second bias voltage 92, $V_+$, and the four second sensors 66 of resistive sensor pairs $62_{4-7}$ (coupled to inverting voltage buffers 70) are connected to first bias voltage 90, $V_-$. Thus, for a gain setting 114 of "00001111" the output of the four resistive sensor pairs $62_{4-7}$ effectively "cancels out" the output of the four resistive sensor pairs $62_{0-3}$, meaning that no resistive sensor pairs 62 are "active" in sensing. As such gain setting 114 of "00001111" yields a normalized system gain 116 that is equal to 0.00. Therefore, output signal 94, $V_{OUT}$, is fully attenuated.

The second and third examples described above demonstrate a passive capability for attenuating the sensitivity of resistive sensor system. In other words, when a first quantity of a first portion of resistive sensor pairs 62 differs from a second quantity of a second portion resistive sensor pairs 62, the difference between the first quantity and the second quantity defines an active set of resistive sensor pairs 62 for sensing the measured property. Further, the active set of resistive sensor pairs 62 may characterize an attenuated (e.g., reduced) sensitivity of resistive sensor system 60 to the measured property. The active set of resistive sensor pairs 62 is thus configured to produce output signal 94 at output node 80 in response to the measured property, where output signal 94 may be reduced by the attenuated sensitivity.

With gain setting 114 of "11111111," the overall sensitivity of resistive sensor system 60 is maximum, but the polarity is inverted, such that the normalized system gain 116 is −1.00. With other combinations of gain settings 114, normalized system gain 116 can be programmed between −1.00 and +1.00.

Figure 7:
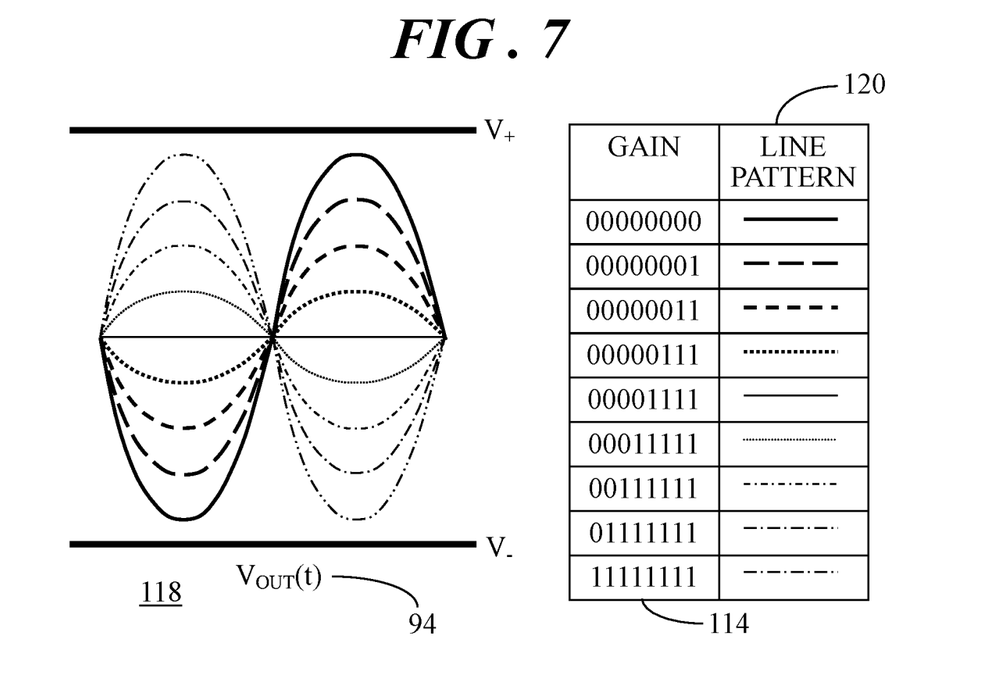
FIG. 7 shows a diagram of waveforms of various output signals corresponding to normalized system gains shown in the table of FIG. 6.

Referring now to FIGS. 6-7, FIG. 7 shows a diagram 118 of waveforms of various output signals 94 corresponding to normalized system gain 116 for gain settings 114 shown in table 112 (FIG. 6). FIG. 7 further includes a legend delineating each line pattern used to distinguish the separate waveforms in connection with gain settings 114. In FIG. 7, an output signal (e.g., output voltage 94) at output node 80 (FIG. 3) of resistive sensor system may vary over time (t) between $V_+$ and $V_-$. However, output voltage 94 may be attenuated and/or inverted in accordance with a particular gain setting 114.

Accordingly, the topology of resistive sensor system 60 utilizes the existing area of resistive sensor pairs 62 to realize various sensitivity settings. In contrast to the prior art, there is no additional active circuitry, except for the noninverting and inverting buffers utilized as noninverting and inverting switching elements 68, 70 (FIG. 3) driving the first and second sensors 64, 66. Only the signal is attenuated, in a linear manner, without introducing any extra error sources and/or increasing power consumption and area.

Additionally, because the impedance of resistive sensor bridge circuit 85 (FIG. 3) is kept constant in all gain settings 114, the thermal noise floor will not increase.

Figure 8:
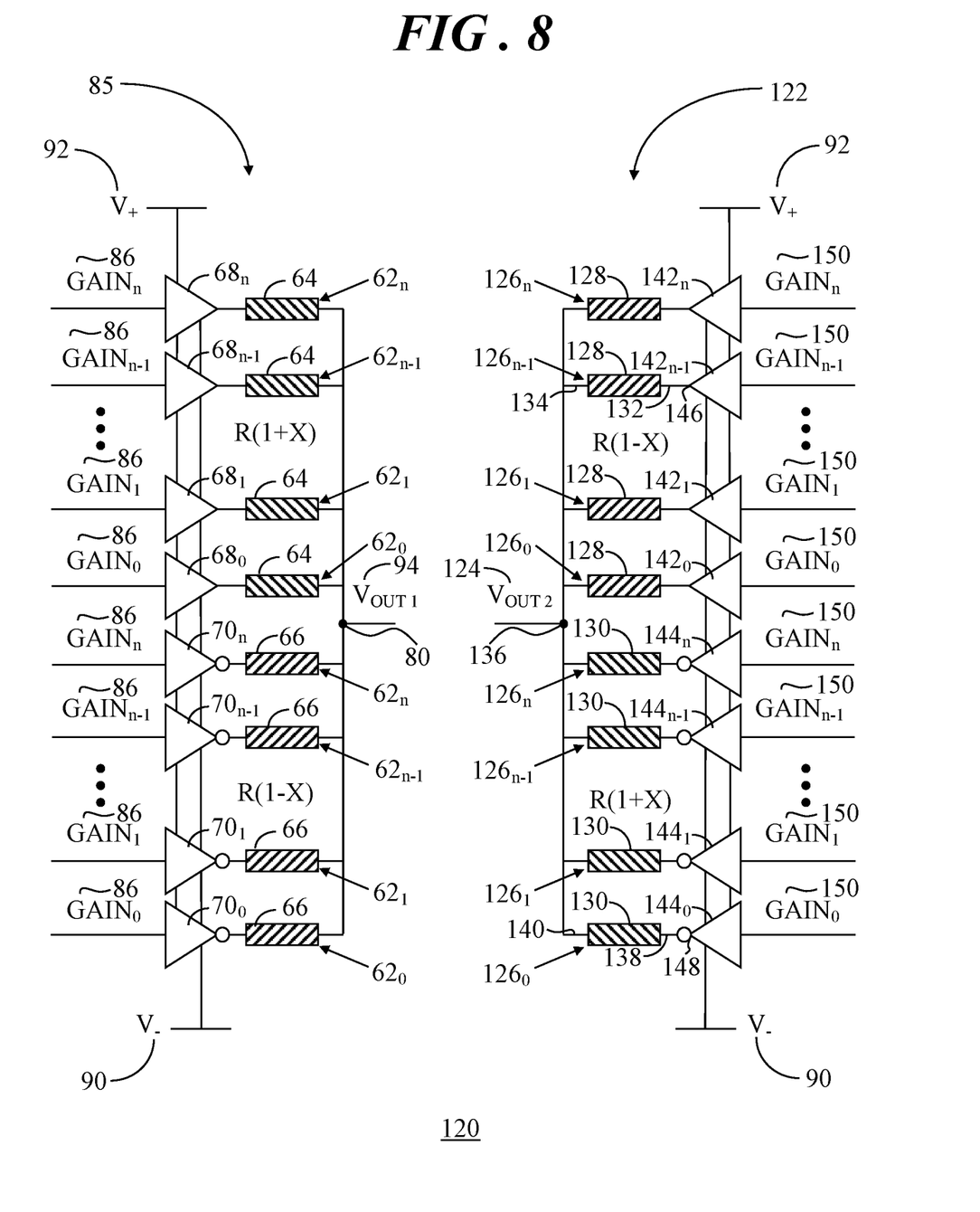
FIG. 8 shows a diagram of a resistive sensor system in accordance with another embodiment.

FIG. 8 shows a diagram of a resistive sensor system 120 in accordance with another embodiment. The above discussion was directed toward a resistive sensor system having a single-ended bridge configuration. However, the passive attenuation topology discussed above may additionally be applied to resistive sensor system 120 having a differential bridge (e.g., Wheatstone bridge) configuration. Thus, resistive sensor system 120 includes single-ended resistive sensor bridge circuit 85 as a first bridge circuit configured to produce output signal 94 as a first output signal 94, $V_{OUT1}$, at output node 80. A discussion of bridge circuit 85 will not be repeated herein for brevity. Resistive sensor system 120 further includes a second bridge circuit 122 configured to produce a second output signal 124, $V_{OUT2}$. Together bridge circuits 85, 122 form a differential bridge circuit in which a differential output signal is a difference between first and second output signals 94, 124 (e.g., $V_{OUT}=V_{OUT1}-V_{OUT2}$).

Second bridge circuit 122 includes second resistive sensor pairs 126 formed of third and fourth sensors 128, 130 of opposite sensitivity directions to the measured property. In the illustrated embodiment, first sensors 64 and fourth sensors 130 have the first sensitivity direction (e.g., positive sensitivity, represented by R(1+X),) and second and third sensors 66, 128 have the second sensitivity direction (e.g., negative sensitivity, represented by R(1−X)). Each of third sensors 128 has fifth and sixth terminals 132, 134 in which sixth terminal 132 is coupled to a second output node 136 of second bridge circuit 122. Each of fourth sensors 130 has seventh and eighth terminals 138, 140, in which eighth terminal 140 is coupled to sixth terminal 134 at second output node 136.

Second bridge circuit 122 includes the same quantity of resistive sensor pairs 126 as resistive sensor pairs 62 of bridge circuit 85. Thus, in the example of "n" resistive sensor pairs, a first resistive sensor pair $126_0$ includes third and fourth sensors 128, 130, a second resistive sensor pair $126_1$ includes third and fourth sensors 128, 130, and so forth, through an "nth" resistive sensor pair $126_n$ that likewise includes third and fourth sensors 128, 130.

Second bridge circuit 122 of resistive sensor system 120 further includes multiple noninverting switch elements 142 (which may be noninverting voltage buffers as described in connection with FIG. 4) and multiple inverting switch elements 144 (which may be inverting voltage buffers as described in connection with FIG. 5). Each of noninverting switch elements 142 has a noninverting output 146 coupled to fifth terminal 132 of one of third sensors 128, and each of inverting switch elements 144 has an inverting output 148 coupled to seventh terminal 138 of one of fourth sensors 130.

Noninverting switch elements 142 may alternatively be referred to herein as noninverting voltage buffers 142, and inverting switch elements 144 may alternatively be referred to herein as inverting voltage buffers 144. Noninverting voltage buffers 142 are labeled $142_0$, $142_1$, $142_{n-1}$, $142_n$ to correspond with nomenclature used with resistive sensor pairs $126_0$, $126_1$, $126_{n-1}$, $126_n$. Likewise, inverting voltage buffers 144 are labeled $144_0$, $144_1$, $144_{n-1}$, $144_n$ to correspond with nomenclature used with resistive sensor pairs $126_0$, $126_1$, $126_{n-1}$, $126_n$. However, in general discussion the noninverting switch elements will be referred to altogether as noninverting voltage buffers 142 and the inverting switch elements will be referred to altogether as inverting voltage buffers 144.

For each resistive sensor pair 126, noninverting and inverting voltage buffers 142, 144 coupled to their corresponding third and fourth sensors 128, 130 are configured to receive switch signals 150. Switch signals 150 are the same as those provided in bridge circuit 85. For example, noninverting and inverting voltage buffers $142_0$, $144_0$ associated with resistive sensor pair $126_0$ receives switch signal 150, labeled $GAIN_0$, as does noninverting and inverting voltage buffers $68_0$, $70_0$ associated with resistive sensor pair $62_0$; noninverting and inverting voltage buffers $142_1$, $144_1$ associated with resistive sensor pair $126_1$ receives switch signal 150, labeled $GAIN_1$, as does noninverting and inverting voltage buffers $68_1$, $70_1$ associated with resistive sensor pair $62_1$; and so forth.

In general, switch signals 150 are configured to control noninverting and inverting voltage buffers 142, 144 such that the associated third and fourth sensors 128, 130 are biased in opposition to one another. Further, switch signals 150 are configured to control noninverting and inverting voltage buffers 142, 144 such that third sensors 128 of second bridge circuit 122 are biased in opposition to second sensors 66 of first bridge circuit 85, and fourth sensors 130 of second bridge circuit 122 are biased in opposition to first sensors 62 of first bridge circuit 85.

Accordingly, FIG. 8 demonstrates the implementation of a passive attenuation strategy in a differential resistive bridge configuration. Like resistive sensor system 60, resistive sensor system 120 utilizes the existing area of resistive sensor pairs 62, 126 to realize various sensitivity settings. And again, there is no additional active circuitry, except for the noninverting and inverting buffers utilized as noninverting and inverting switching elements driving the sensors. Only the signal is attenuated, in a linear manner, without introducing any extra error sources. And, because the impedance of the bridge circuits of the differential configuration is kept constant in all gain settings, the thermal noise floor will not increase.

Figure 9:
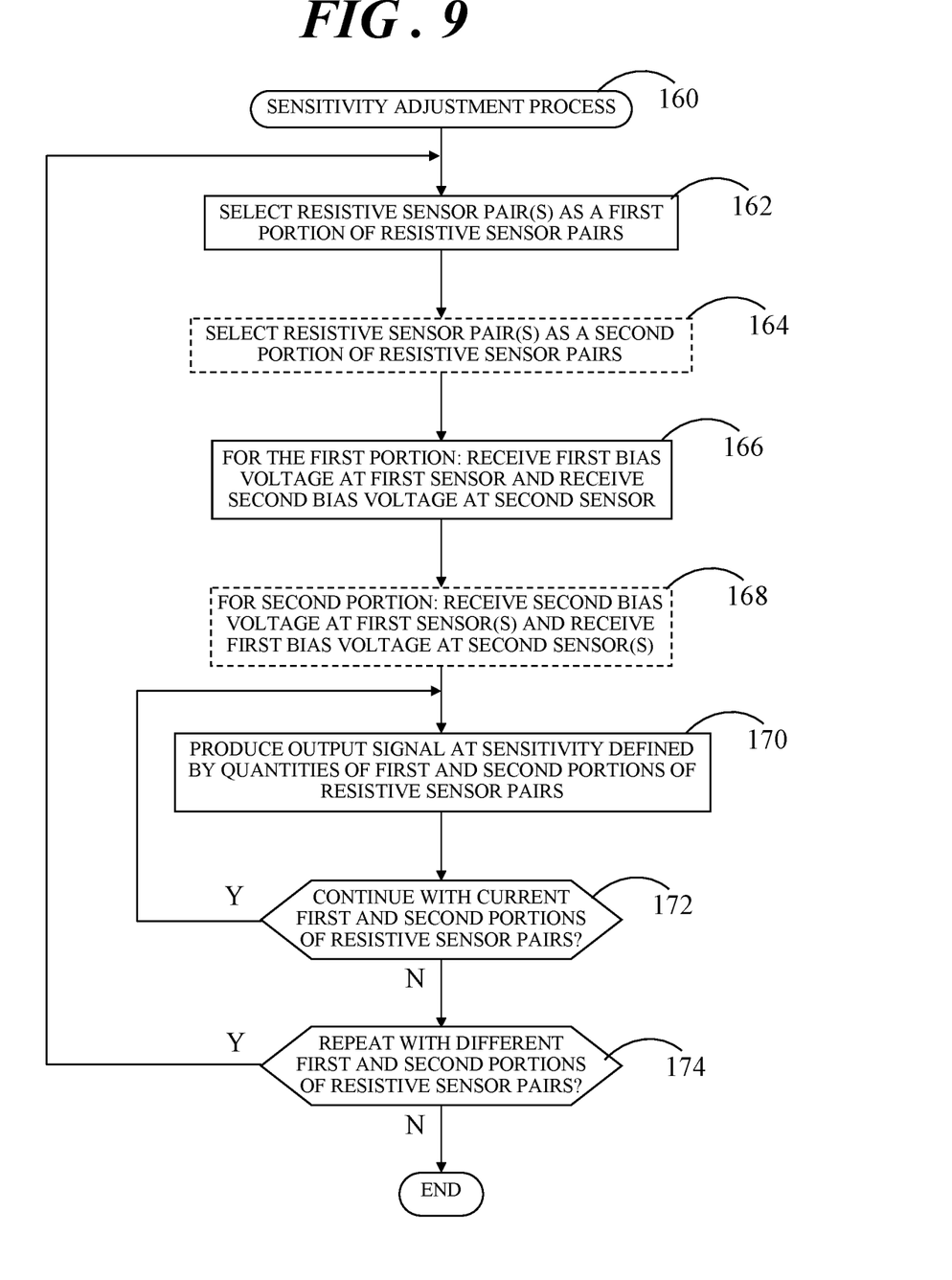
FIG. 9 shows a flowchart of a sensitivity adjustment process in accordance with another embodiment.

FIG. 9 shows a flowchart of a sensitivity adjustment process 160 in accordance with another embodiment. Process 160 will be discussed in connection with resistive sensor system 60, shown in FIG. 3. Thus, reference should be made to FIG. 3 in conjunction with FIG. 9.

At a block 162, a first portion of resistive sensor pairs (e.g., resistive sensor pairs 62) of the total quantity of resistive sensor pairs in the resistive sensor system is selected. At a block 164, the remaining resistive sensor pairs (e.g., resistive sensor pairs 62) of the resistive sensor system are selected to be a second portion of resistive sensor pairs. The quantity for each of the first and second portions may depend upon a desired attenuation level as demonstrated in FIGS. 6 and 7. Block 164 is illustrated as a dashed line box to indicate that if all of the resistive sensor pairs are selected as the first portion at block 162, then the second portion of the resistive sensor pairs will contain zero resistive sensor pairs.

At a block 166, for the first portion of the resistive sensor pairs, a first bias voltage (e.g., first bias voltage 90) is received at the first sensors (e.g., first sensors 64) and a second bias voltage (e.g., second bias voltage 92) is received at the second sensors (e.g., second sensors 66). At a block 168, for the second portion of the resistive sensor pairs, the second bias voltage (e.g., second bias voltage 92) is received at the first sensors (e.g., first sensors 64) and the first bias voltage (e.g., first bias voltage 90) is received at the second sensors (e.g., second sensors 66). Receipt of the first and second bias voltages may be controlled by the noninverting and inverting switch elements (e.g., noninverting and inverting voltage buffers 68, 70) as described in detail in connection with FIGS. 3-7. Block 168 is illustrated as a dashed line box to indicate that if all of the resistive sensor pairs were selected as the first portion at block 162, then block 168 will not be performed since the second portion of the resistive sensors pairs contains zero resistive sensor pairs. At a block 170, an output signal (e.g., output signal 94) is produced at a sensitivity defined by the quantities of the first and second portions of resistive sensor pairs, as demonstrated in FIG. 6.

At a query block 172, a determination is made as to whether to continue operation with the current sets of the first and second portions of the resistive sensor pairs. For example, operation may continue with the current sets of the first and second portions of the resistive sensor pairs defining a particular system gain. When a determination is made at block 172 to continue system operation, process control loops back to block 170 to continue producing the output signal at the sensitivity defined by the quantities of the first and second portions of resistive sensor pairs. When a determination is made at block 172 to discontinue utilizing the current sets of the first and second portions of the resistive sensor pairs, process control continues to a query block 174.

At query block 174, a determination is made as to whether to repeat the process with different first and second portions of resistive sensor pairs. For example, a determination may be made to further attenuate the sensitivity or to increase the sensitivity of the system. When a determination at block 174 is made to repeat with different first and second portions of resistive sensor pairs, process control loops back to blocks 162 and 164 to select first and second portions of resistive sensor pairs, continues with blocks 166 and 168 to receive the first and second bias voltages in accordance with the selected first and second portions of the resistive sensor pairs, and to produce and the output signal. When a determination is made at block 174 to cease operation of resistive sensor system, sensitivity adjust process 160 ends.

The topology of the resistive sensor systems, as described above, enables adjustment of the overall sensitivity of the resistive sensor system by controlling the biasing of resistive sensor pairs in a bridge circuit. However, the topology and methodology described above may be combined with, for example, Dynamic Element Matching (DEM) techniques or for applying amplitude modulation techniques.

DEM is a technique that may be implemented to reduce the impact of mismatch between electrical components, and is typically used in Analog to Digital Converters (ADCs) and Digital to Analog Converters (DACs). When applied in connection with the above described topology, the mismatch between the sensors need not to be detected. Rather, by switching the gain setting (e.g., gain settings 114, FIG. 6) at a very high frequency, the mismatch of each sensor will momentarily be seen at the output voltage (e.g., output signal 94, FIG. 3). This mismatch may be averaged out and removed through voltage filtering. Using the example provided in FIG. 6, in a case of normalized system gain 116 of 0.75, there is no difference between gain setting 114 of "00000001" and "10000000." That is, any single sensor pair $62_{1-8}$ could be set to "1" when all others are set to "0" and normalized system gain 116 would remain 0.75. Accordingly, the single "1" can be "shifted" through all positions from "10000000" through "01000000" until "00000001" in a round-robin sequence (e.g., dynamically selected) to reduce the influence of mismatch between the sensors.

Thus, when implementing a DEM technique and referring to process 160, at block 162, one of the resistive sensor pairs is selected for the first portion of the resistive sensor pairs and at block 164, the remainder of the sensor pairs is selected for the second portion of the sensor pairs. Thereafter, the receiving the first bias voltage at block 166, receiving the second bias voltage at block 168, and producing the output signal at block 170 are performed. And, at query block 174, the process is successively repeated for each of the resistive sensor pairs to shift through all positions (e.g., from "10000000" through "01000000" until "00000001" in a round-robin sequence). More specifically, when implementing a DEM technique, a determination may be made that if the selected gain is correct the resistive sensor pairs can be shifted to another position and program control loops back to block 162.

The gain input (e.g., gain settings 114) may also be used as a modulation input to modulate the amplitude of the sensor output signal (e.g., output signal 94). By way of example, and assuming that the sensors are magnetic field sensors, whose output signal changes over time:

$$M(t)=(a+\cos(f_1 \cdot t)) \cdot \text{Gain} \qquad (1)$$

The sensor output (e.g., output signal 94) can then be expressed as follows:

$$V_{OUT}(t)=M(t) \cdot \text{Gain}=(a+\cos(f_1 \cdot t)) \cdot \text{Gain} \qquad (2)$$

When gain is also changing over time (by changing gain settings 114), the resistive sensor system can behave like an amplitude modulator.

$$\text{Gain} = \cos(f_2 \cdot t), \text{ with } f_2 \gg f_1 \qquad (3)$$

$$\begin{aligned} V_{OUT}(t) &= M(t) \cdot \text{gain} \\ &= (a + \cos(f_1 \cdot t)) \cdot \cos(f_2 \cdot t) \\ &= a \cdot \cos(f_2 \cdot t) + 0.5(\cos((f_1 - f_2) \cdot t) + \\ &\quad 0.5(\cos((f_1 + f_2) \cdot t) \end{aligned} \qquad (4)$$

The sensor output signal (e.g., output signal 94) is now shifted from DC (0 Hz) to $f_2$. This technique may be used in resistive sensor systems where chopping is used to remove offset of the circuits processing the sensor output signal. Typically, a square wave is used for chopping, but a square wave creates a wide frequency spectrum with many harmonics of the chop frequency. This wide spectrum can lead to performance loss (limited bandwidth, unwanted mixing of frequencies, and so forth. The square wave chopping signal may be replaced by a sinusoidal signal (e.g., a "stepped sine" shape) by changing gain settings 114. The sinusoidal signal has a significantly lower bandwidth, as compared to a square wave. Thus, the higher harmonics can be suppressed at the input of the analog front-end.

Accordingly, the topology of the resistive sensor systems described herein enables adjustment of the overall sensitivity of the resistive sensor system by controlling the biasing of resistive sensor pairs in a bridge circuit, which may be combined DEM techniques and/or for applying amplitude modulation techniques.

Embodiments disclosed herein entail a resistive sensor system and methodology for adjusting the overall sensitivity of the resistive sensor system. More particularly, the system includes capability for controlling the biasing of one or more resistive sensor pairs in a bridge circuit of a resistive sensor system in such a way that the overall gain of the resistive sensor system changes, but the noise floor and output impedance remain identical in all gain settings. Moreover, dynamic element matching techniques and amplitude modulation techniques for the sensing elements are enabled. Still further, the electrical output signal of the resistive sensor system can be attenuated using the resistive sensor pairs themselves, resulting in minimal integrated circuit (IC) area and power overhead, and no additional error sources in the processing path.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A resistive sensor system comprising:
    resistive sensor pairs formed of first and second sensors of opposite sensitivity directions to a measured property, each resistive sensor pair comprising:
        one of the first sensors, the first sensor having a first terminal and a second terminal; and
        one of the second sensors, the second sensor having a third terminal and a fourth terminal, the fourth terminal being coupled to the second terminal of the first sensor;
    multiple noninverting switch elements, each noninverting switch element having a noninverting output coupled to the first terminal of one the first sensors; and
    multiple inverting switch elements, each inverting switch element having an inverting output coupled to the third terminal of one of the second sensors, wherein for each resistive sensor pair, the noninverting and inverting switch elements coupled to corresponding first and second sensors are configured to receive a switch signal, the switch signal being configured to control the noninverting and inverting switch elements such that the first and second sensors are biased in opposition to one another.

2. The resistive sensor system of claim 1 further comprising a controller in communication with each of noninverting and inverting switch elements, wherein the controller provides the switch signal to each of the noninverting and inverting switch elements.

3. The resistive sensor system of claim 1 wherein for each of the resistive sensor pairs, the switch signal controls connection of the first sensor to one of a first bias voltage and a second bias voltage via the noninverting switch element and the switch signal controls connection of the second sensor to the other of the first and second bias voltages via the inverting switch element.

4. The resistive sensor system of claim 1 wherein:
    the switch signal comprises a digital voltage signal having a first logic state or a second logic state, the first logic state defining a first bias voltage and the second logic state defining a second bias voltage;
    the noninverting switch elements comprise first voltage buffers, each of the first voltage buffers having a first input terminal and the noninverting output, each of the first voltage buffers being configured to receive the digital voltage signal at the first input terminal and output from the noninverting output one of the first and second bias voltages corresponding to the first or second logic state of the digital voltage signal; and the inverting switch elements comprise second voltage buffers, each of the second voltage buffers having a second input terminal and the inverting output, each of the second voltage buffers being configured receive the digital voltage signal at the second input terminal, invert the digital voltage signal to the other of the first or second states, and output from the second output terminal the other of the first and second bias voltages corresponding to the other of the first or second logic states.

5. The resistive sensor system of claim 1 wherein the first and second sensors are magnetic field sensors configured to provide a changing resistance in response to a changing magnetic field.

6. The resistive sensor system of claim 1 wherein:
for a first portion of the resistive sensor pairs, the received switch signal defines a first bias voltage;
for a second portion of the resistive sensor pairs, the received switch signal defines a second bias voltage, wherein:
in response to the switch signal defining the first bias voltage for the first portion, the first sensor of each resistive sensor pair of the first portion receives the first bias voltage via the corresponding noninverting switch element and the second sensor of each resistive sensor pair of the first portion receives the second bias voltage via the corresponding inverting switch element; and
in response to the switch signal defining the second bias voltage for the second portion, the first sensor of each resistive sensor pair of the second portion receives the second bias voltage via the corresponding noninverting switch element and the second sensor of each resistive sensor pair of the second portion receives the first bias voltage via the corresponding inverting switch element.

7. The resistive sensor system of claim 6 wherein when a first quantity of the resistive sensor pairs of the first portion differs from a second quantity of the resistive sensor pairs of the second portion, the difference between the first quantity and the second quantity defines an active set of resistive sensor pairs for sensing the measured property, the active set of the resistive sensor pairs characterizing an attenuated sensitivity of the resistive sensor system to the measured property.

8. The resistive sensor system of claim 7 wherein:
the second terminal of each of the first sensors is coupled to an output node,
the fourth terminal of each of the second sensors is coupled to the output node, and the active set of resistive sensor pairs is configured to produce an output signal at the first node in response to the measured property, the output signal being reduced by the attenuated sensitivity.

9. The resistive sensor system of claim 1 wherein the switch signal defines one of a first bias voltage and a second bias voltage, and when the switch signal defines one of the first and second bias voltages for all of the resistive sensor pairs, the first sensors of all of the resistive sensor pairs receive the one of the first and second bias voltages via the noninverting switch elements and the second sensors all of the resistive sensor pairs receive the other of the first and second bias voltages via the inverting switch elements.

10. The resistive sensor system of claim 9 wherein when the switch signal defines the one of the first and second bias voltages for all of the resistive sensor pairs, all of the resistive sensor pairs define an active set of the resistive sensor pairs for sensing the measured property, the active set of the resistive sensor pairs characterizing a full sensitivity of the resistive sensor system to the measured property.

11. The resistive sensor system of claim 1 wherein:
a first resistive bridge circuit comprises the resistive sensor pairs, the multiple noninverting switch elements, and the multiple inverting switch elements, the second terminal of each of the first sensors is coupled to a first output node, and the fourth terminal of each of the second sensors is coupled to the first output node, and the resistive sensor pairs are configured to produce a first output signal at the first output node in response to the measured property; and
the resistive sensor system further comprises a second resistive bridge circuit, the first and second bridge circuits forming a differential bridge circuit, the second resistive bridge circuit comprising:
second resistive sensor pairs formed of third and fourth sensors of opposite sensitivity directions to the measured property, wherein the first and fourth sensors have a first sensitivity direction and the second and third sensors have a second sensitivity direction, each second resistive sensor pair comprising:
one of the third sensors, the third sensor having a fifth terminal and a sixth terminal, the sixth terminal being coupled to a second output node; and
one of the fourth sensors, the fourth sensor having a seventh terminal and an eighth terminal, the eighth terminal being coupled to the second output node;
multiple second noninverting switch elements, each second noninverting switch element having a second noninverting output coupled to the fifth terminal of one the third sensors; and
multiple second inverting switch elements, each second inverting switch element having a second inverting output coupled to the seventh terminal of one of the fourth sensors, wherein for each second resistive sensor pair, the second noninverting and inverting switch elements coupled to corresponding third and fourth sensors are configured to receive a second switch signal, the second switch signal being configured to control the second noninverting and inverting switch elements such that the third and fourth sensors are biased in opposition to one another, the second resistive sensor pairs are configured to produce a second output signal at the second output node in response to the measured property, and the differential bridge circuit is configured to produce a differential output signal as a difference between the first and second output signals.

12. The resistive sensor system of claim 11 wherein the second switch signal is further configured to control the second noninverting and inverting switch elements such that the third sensors are biased in opposition to the second sensors of the first resistive bridge circuit and the fourth sensors are biased in opposition to the first sensors of the first resistive bridge circuit.

13. A resistive sensor system comprising:
resistive sensor pairs formed of first and second sensors of opposite sensitivity directions to a measured property, each resistive sensor pair comprising:

one of the first sensors, the first sensor having a first terminal and a second terminal; and one of the second sensors, the second sensor having a third terminal and a fourth terminal, the fourth terminal being coupled to the second terminal of the first sensor;

multiple noninverting switch elements, the noninverting switch elements comprising first voltage buffers, each of the first voltage buffers having a first input terminal and a noninverting output coupled to the first terminal of one the first sensors; and multiple inverting switch elements, the inverting switch elements comprising second voltage buffers, each of the second voltage buffers having a second input terminal and an inverting output coupled to the third terminal of one of the second sensors, wherein:

for each resistive sensor pair, the noninverting and inverting switch elements coupled to corresponding first and second sensors are configured to receive a switch signal;

the switch signal comprises a digital voltage signal having a first logic state or a second logic state, the first logic state defining a first bias voltage and the second logic state defining a second bias voltage;

each of the first voltage buffers is configured to receive the digital voltage signal at the first input terminal and output from the first output terminal one of the first and second bias voltages corresponding to the first or second logic state of the digital voltage signal; and each of the second voltage buffers is configured receive the digital voltage signal at the second input terminal, invert the digital voltage signal to the other of the first or second states, and output from the second output terminal the other of the first and second bias voltages corresponding to the other of the first or second logic states such that the first and second sensors are biased in opposition to one another.

14. The resistive sensor system of claim 13 further comprising a controller in communication with each of noninverting and inverting switch elements, wherein the controller provides the switch signal to each of the noninverting and inverting switch elements.

15. The resistive sensor system of claim 13 wherein:

for a first portion of the resistive sensor pairs, the received switch signal defines the first bias voltage;

for a second portion of the resistive sensor pairs, the received switch signal defines the second bias voltage, wherein:

in response to the switch signal defining the first bias voltage for the first portion, the first sensor of each resistive sensor pair of the first portion receives the first bias voltage via the corresponding noninverting switch element and the second sensor of each resistive sensor pair of the first portion receives the second bias voltage via the corresponding inverting switch element; and in response to the switch signal defining the second bias voltage for the second portion, the first sensor of each resistive sensor pair of the second portion receives the second bias voltage via the corresponding noninverting switch element and the second sensor of each resistive sensor pair of the second portion receives the first bias voltage via the corresponding inverting switch element.

16. The resistive sensor system of claim 15 wherein:

when a first quantity of the resistive sensor pairs of the first portion differs from a second quantity of the resistive sensor pairs of the second portion, the difference between the first quantity and the second quantity defines an active set of resistive sensor pairs for sensing the measured property, the active set of the resistive sensor pairs characterizing an attenuated sensitivity of the resistive sensor system to the measured property;

the second terminal of each of the first sensors is coupled to an output node; and the fourth terminal of each of the second sensors is coupled to the output node, and the active set of resistive sensor pairs is configured to produce an output signal at the first node in response to the measured property, the output signal being reduced by the attenuated sensitivity.

17. The resistive sensor system of claim 13 wherein when the switch signal defines one of the first and second bias voltages for all of the resistive sensor pairs, the first sensors of all of the resistive sensor pairs receive the one of the first and second bias voltages via the noninverting switch elements and the second sensors all of the resistive sensor pairs receive the other of the first and second bias voltages via the inverting switch elements.

18. The resistive sensor system of claim 17 wherein:

when the switch signal defines the one of the first and second bias voltages for all of the resistive sensor pairs, all of the resistive sensor pairs define an active set of the resistive sensor pairs for sensing the measured property, the active set of the resistive sensor pairs characterizing a full sensitivity of the resistive sensor system to the measured property;

the second terminal of each of the first sensors is coupled to an output node; and the fourth terminal of each of the second sensors is coupled to the output node, and the active set of resistive sensor pairs is configured to produce an output signal at the first node in response to the measured property, the output signal being at full sensitivity.

* * * * *